United States Patent [19]
Nakatani et al.

[11] Patent Number: 5,449,863
[45] Date of Patent: Sep. 12, 1995

[54] PRINTED CIRCUIT BOARD

[75] Inventors: Fumio Nakatani, Yamatokoriyama; Shinichi Wakita, Akashi; Hisatoshi Murakami, Higashiosaka; Tsunehiko Terada, Ikeda; Shohei Morimoto, Higashiosaka, all of Japan

[73] Assignee: Tatsuta Electric Wire & Cable Co., Inc., Japan

[21] Appl. No.: 220,257

[22] Filed: Mar. 30, 1994

Related U.S. Application Data

[62] Division of Ser. No. 477,322, Feb. 8, 1990.

[30] Foreign Application Priority Data

Feb. 21, 1989 [JP] Japan .................. 1-019218
Feb. 21, 1989 [JP] Japan .................. 1-019219
Feb. 21, 1989 [JP] Japan .................. 1-019220
Feb. 21, 1989 [JP] Japan .................. 1-040836
Feb. 21, 1989 [JP] Japan .................. 1-040837
Feb. 21, 1989 [JP] Japan .................. 1-040838

[51] Int. Cl.[6] .............................................. H05K 1/00
[52] U.S. Cl. .................................. 174/250; 174/262; 174/266; 361/792; 361/794
[58] Field of Search ............... 174/250, 262, 263, 264, 174/265, 266; 361/784, 790, 792, 794

[56] References Cited

U.S. PATENT DOCUMENTS 5,003,273  3/1991  Oppenberg .
5,285,017  2/1994  Gardner .
5,294,755  3/1994  Kawakani et al. .

Primary Examiner—Leo P. Picard
Assistant Examiner—Cheryl R. Figlin

[57] ABSTRACT

The radiation noise suppression effect is enhanced by providing an insulation layer which is formed so that the circuit pattern is covered excepting at least a part of power source pattern or ground pattern on the substrate on which circuit pattern is formed, and a conductive layer which is formed so as to be connected to the uninsulated part of the power source pattern or the ground pattern on the insulation layer, by modifying pattern shape of the conductive layer and the insulation layer or by increasing or reducing the number of these layers.

13 Claims, 12 Drawing Sheets

PRINTED CIRCUIT BOARD

This is a division of application Ser. No. 07/477,322, filed on Feb. 8, 1990.

BACKGROUND OF THE INVENTION

1. Field of the Invention

This invention relates to a printed circuit board to be used in electronic equipment, in particular a printed circuit board for which electromagnetic interference (EMI) preventing means is provided.

2. Description of the Prior Art

The recent progress of electronic equipment is facilitating the trend toward increase of operation speed and density of circuits formed as printed circuit board, as a result which regulations are becoming more severe. One of the typical EMI preventing means which are conventionally applied is to reduce the radiation noise and incoming noise is covering the printed circuit board with the shield case.

However, this method causes a problem in that the electromagnetic wave energy enclosed in the shield case is emitted outwards through cables. Moreover, this method is not basically intended to reduce the electromagnetic wave energy which is generated due to high frequency characteristics of the circuit. Therefore it is almost impossible to completely suppress the radiation noise. Hence, a new printed circuit board directed to supply EMI has been proposed (U.S. Pat. No. 4,801,489). This printed circuit board features that an insulation layer (hereinafter this insulation layer is called the undercoat layer) is formed, excepting at least a part of ground pattern, on a substrate on which a signal line pattern (hereinafter referred to as signal pattern), a ground line pattern (herein after referred to as ground pattern) and a power line pattern (hereinafter referred to as power supply pattern) are formed, and a conductive layer such as a conductive paste layer is formed thereon so as to be connected to an uninsulated part of the ground pattern.

Usually, another insulation layer (hereinafter referred to as an overcoat layer) is formed on this conductive layer.

Radiation noise can be reduced in printed circuit boards of such a configuration mainly for the following four reasons.

Firstly, reduction of ground pattern impedance is provided by the conductive layer.

Secondly, removal of high frequency components from the signal pattern and power supply pattern are provided by the adjacent conductive layer. That is, since the undercoat layer which is formed with so-called solder resist is thin, about 20 to 40 μm in thickness, the distributed electrostatic capacity of the signal pattern and power supply pattern with respect to the conductive layer which is formed thereon and connected to the ground pattern is significant. Accordingly, unnecessary high frequency components which are generated by ringing are grounded to the ground pattern with high frequency, so that the radiation noise is suppressed.

Thirdly, equalization of impedance of the signal pattern and power supply pattern are provided by the conductive layer. That is, since the signal pattern and the power supply pattern are covered by the conductive layer, the distance between these circuit patterns and the conductive layer connected to the ground pattern is equalized, and the impedance of each circuit pattern is equalized. As a result, impedance mismatch in high frequency transmission and generation of unnecessary high frequency components which are caused thereby are suppressed.

Another reason is a shielding effect caused by conductive layer itself.

Owing to these four reasons, than is reduction of impedance of the ground pattern by the conductive layer, removal of high frequency components by the adjacent conductive layer, equalization of impedance of the circuit pattern, and the ordinary shielding effect of the conductive layer itself, the radiation noise can be effectively suppressed.

However, in the conventional printed circuit board employing conventional EMI preventing means, the width of the ground pattern lead to the IC ground pattern is small, so that the impedance at high frequency is high, resulting in the occurrence of a potential difference along its length and, thereby, in an unstable ground level of the IC. As a result of fluctuation of this ground level, radiation noise is caused, and by the same reason radiation noise is caused in the output signal of the IC. Due to this, a sufficient effect of the EMI preventing means cannot be obtained.

Usually, in the electronic circuit board, a bypass capacitor to bypass high frequency noise is provided on the connector located at the end of the substrate, power supply terminal and ground terminal. The required function of this bypass capacitor is to bypass the unnecessary high frequency components. Therefore a bypass capacitor of relatively small capacitance is used. In the conventional printed circuit board, this bypass capacitor is mounted on the substrate as a discrete part. Therefore soldering is required to mount the capacitor on the substrate, which impedes reduction of the size of the substrate. Moreover, the lead wire of the bypass capacitor causes inductance at high frequency, as a result of which the frequency characteristics of impedance are degraded.

Generally, in the conventional printed circuit board, a proper number of bypass capacitors are provided between the ground pattern and the circuit pattern or between power supply pattern and ground pattern so as to bypass the unnecessary high frequency components. In the conventional printed circuit board, however, this bypass capacitor is mounted on the substrate by soldering as a discrete part. Therefore, soldering is required, and existence of the bypass capacitor impedes the reduction of size of the substrate.

Moreover, the lead wire of the bypass capacitor causes inductance at high frequency, as a result of which the frequency characteristics of impedance are degraded.

In the conventional printed circuit board having the features that the conductive layer is formed on the undercoat layer, the conductive layer is formed only around the IC excepting the part just below the IC. Therefore the effect of the conductive layer could not be sufficiently utilized.

As a result of persistent examination and the tests of above-mentioned printed circuit boards it has been revealed that sufficient effect cannot be obtained as to reduction of radiation noise (high frequency noise) of electromagnetic wave for some shapes of signal pattern included in circuit pattern. There is a problem that if the interior the angle of signal pattern of bent part is near 90°, the radiation noise reduction effect cannot be obtained sufficiently. The reason is unknown yet. It is assumed that the impedance mismatching occurs in the bent part, resulting in generation of a reflected wave, which causes increase of equivalent high frequency impedance. Especially, for the fine pitch high integration circuit board, CAD is used for designing the circuit pattern. Most of circuit boards having the circuit pattern which has been designed with the aid of this support device feature that the bent part of signal pattern has angle of 90°. As the rule of wire width and pitch of signal line of such a board is made more strict, the radiation noise becomes more noticeable.

The layout of a printed circuit board is varied depending on uses. Hence, in some cases sufficient ground pattern area to connect a conductive layer cannot be provided. In these cases the area to connect the ground pattern and the conductive layer is small, and high frequency impedance is increased, resulting in reduction of effect. To prevent potential difference in the ground circuit, it is desirable to connect the ground pattern and the conductive layer in several places. If such a connection is impossible owing to restrictions of layout, the requirement to reduce EMI could not be satisfied sufficiently.

SUMMARY OF THE INVENTION

In brief, the present invention is directed to contemplates an enhancement of radiation noise suppression by providing an insulation layer which is formed on a substrate, including a circuit pattern formed thereon so as to said circuit pattern excepting at least a part of the ground pattern or the power supply pattern, and a conductive layer which is formed on said insulation layer so as to be connected to an uninsulated part of the ground pattern or the power supply pattern, by modifying the pattern shape of the conductive layer or the insulation layer or by increasing the number of these layers.

It is accordingly an object of this invention to provide a printed circuit board capable of ensuring excellent EMI prevention even in the case when it is difficult to reduce the impedance owing to a narrow ground pattern lead to the IC ground pin, resulting from layout restriction.

It is a more specific object of the invention to provide a printed circuit board on which the above-mentioned bypass capacitor is formed using the conductive layer.

It is another object of the invention to provide a printed circuit board having the feature that a bypass capacitor is formed by laminating a shield conductive layer at both sides of the insulation layer.

It is still another object of the invention to provide a printed circuit board which is capable of solving the above-mentioned problem by forming a conductive layer also between IC pin insertion holes.

It is a still further object of the invention to provide a printed circuit board having the feature that electromagnetic wave radiation noise reduction effect given by the conductive layer is not degraded even when the signal pattern pitch is made finer.

A further object of the invention is to provide a printed circuit board capable of ensuring an excellent EMI suppression effect in a layout affording easy connection to the power supply pattern even when the conductive layer and ground pattern connection area is restricted.

According to this invention, the IC ground pin connection land of the IC, which is a noise source, is directly connected to the conductive layer so that the IC ground pin connection land is connected to another part of the ground pattern through the conductive layer, the impedance at high frequency of ground pattern between them is lowered, so that the potential of the IC ground pin is stabilized, and the radiation noise generated by the fluctuation of potential is effectively suppressed.

The radiation noise suppression effect is further enhanced as the area of the ground pin connection land is widened, resulting in reduction of the impedance of the connection part.

Even on the EMI-prevented printed circuit board in which the conductive layer is connected to the power supply pattern in place of the ground pattern, the impedance at high frequency of the power supply pattern between them is lowered since the power supply pin connection land of the IC is connected to another part of the power supply pattern through the conductive layer owing to direct connection of the IC power supply pin connection land to the conductive layer, so that the potential of the IC power supply pin is stabilized and the radiation noise generated by the fluctuation of potential can be effectively suppressed.

The reference potential of the IC is further stabilized, as the area of the IC power supply pin connection land is widened as compared to the area of the IC signal pin connection land, so that the radiation noise suppression effect is further enhanced.

In this invention a conductive layer is provided above the connector land, so that a capacitor is composed of this conductive layer and the connector land through the insulation layer. This capacitor serves as a bypass capacitor. Or in the case when the conductive layer exists above the power terminal land, a bypass capacitor is composed of this power terminal land and the conductive layer located hereabove. However, from the viewpoint of radiation noise suppression effect by reduction and unification of circuit impedance an unnecessary high frequency, the same effect is obtained irrespective of whether the conductive layer is connected to the ground pattern of power supply pattern. Accordingly, in the case when it is difficult to connect the ground pattern to the conductive layer owing to restriction of layout but it is rather easy to connect it to the power supply pattern, the conductive layer is connected to the power supply pattern, and at the connector the bypass capacitor is composed of this conductive layer and connector land. Alternatively, the bypass capacitor is composed of the ground terminal land and conductive layer.

Moreover, in this invention, it is possible to compose a capacitor, using the 1st and 2nd conductive layers by interposing the 2nd insulation layer between the 1st and 2nd conductive layers. Accordingly, if the 2nd conductive layer is connected to any part of the circuit pattern the capacitor can be used as a bypass capacitor of the signal line. When the 1st conductive layer is connected to the ground line pattern, a bypass capacitor can be composed between the power supply source and ground by connecting the. 2nd conductive layer to the power line pattern. This bypass capacitor is also composed when the 1st conductive layer is connected to the power line pattern and the 2nd conductive layer is connected to the ground line pattern.

In this invention, unnecessary high frequency components can be reduced by composing a part of the conductive layer so that the IC pin land is not contacted between IC pin insertion holes, as a result of which radiation noise can be suppressed.

If the interior angle of the bent part of signal line pattern is set to approx. 135° or more, it seems that signal reflection at this bent part is reduced. As a result of this, the radiation noise which occurs on the whole printed circuit board is reduced. Similarly, the radiation noise caused on the whole printed circuit board is reduced if the bent part of the signal line pattern is made in the form of a circular arc. These facts have been proved experimentally by the inventor as is discussed later.

In this invention, furthermore, distribution electrostatic capacity of the signal pattern and ground pattern to the conductive layer connected to the power supply pattern increases and the circuit impedance reduces as a result of connection of the conductive layer to the power supply pattern in place of the ground pattern, the circuit impedance reduces, so that unnecessary high frequency components caused by ringing are grounded to the power supply pattern at high frequency, which results in suppression of radiation noise. Since the signal pattern and ground pattern are wholly covered by the conductive layer connected to the power supply pattern, the impedance of each circuit is unified, and as a result of this occurrence of impedance mismatching in high frequency transmission, and generation of unnecessary high frequency components resulting therefrom, are suppressed.

Moreover, the ordinary shield effect given by the conductive layer itself is also added.

BRIEF DESCRIPTION OF THE DRAWINGS

FIG. 10 (B), FIG. 10 (C) FIG. 10 (D) show the bent part of signal line pattern.

DESCRIPTION OF THE PREFERRED EMBODIMENT

Figure 1:
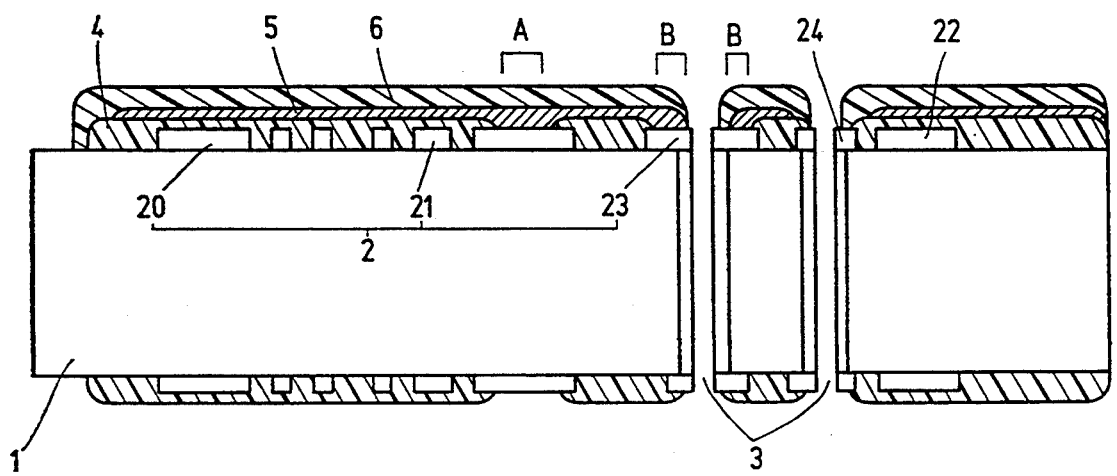
FIG. 1 and FIG. 2 show a cross section of a printed circuit board which is an example of the first embodiment of this invention.

FIG. 1 shows a cross section of a printed circuit board which is an example of a first embodiment of this invention. A circuit pattern 2 made of copper foil is formed on the upper surface of a substrate 1 which is composed of a insulation material such as epoxy resin, phenol resin, glass fiber or ceramics. This circuit pattern 2 includes a signal pattern 20, a ground pattern 21, a power supply pattern 22, an IC ground pin connection land 23 and an IC signal pin connection land 24. Numeral 3 in this figure denotes a through hole. The area of IC ground pin connection land 23 included in the circuit pattern is larger by several times than the area of IC signal pin connection land 24. It is desirable that this IC ground pin connection land has the largest possible area (as large as allowed by the pattern layout). These patterns are formed by known photolithography techniques.

After formation of the required pattern, an undercoat layer 4 is formed, leaving a partial area A of ground pattern 21, a partial area B of IC ground pin connection land 23 and a partial area A of ground pattern. This undercoat layer 4 is a solder resist layer made of resin insulation material. The undercoat layer 4 can be easily formed by screen printing. After the undercoat layer is formed, a conductive paste layer 5 is formed thereon by screen printing. In this example of this embodiment of the present invention, the conductive layer is made of copper paste and is formed so as to cover almost the whole surface of the undercoat layer 4. The material, for example, of the following composition, can be used for the copper paste. Other compositions are also applicable.

Basically, the copper paste is made by mixing the fine copper particles which serve as filler, a binder chosen to bond reliably these particles, and various additives maintain the conductivity stably for a long time. Concretely, it is prepared by mixing 100 wt. % portion of metal copper powder, 10 to 25 wt. portion of resin mixture (consisting of 35 to 50 wt. % of melamine resin, 20 to 35 wt. % of polyester resin, and 15 to 30 wt. % of resolve type phenol resin), 0.5 to 2 wt. portion of fatty acid or its metallic salt and 0.5 to 4 wt. portion of chelate forming agent. Metallic copper powders of flake, resin, spheric or amorphous type can be used. It is desirable that the particle diameter be less than 100 $\mu$m, and preferably 1 to 30 $\mu$m.

After the conductive paste 5 is applied, it is heated to cure. Then the overcoat layer 6, which is made of insulation resin material, is formed on the whole surface of conductive paste layer 5. This overcoat layer 6 can be made of the same material as that of undercoat layer 4. The conductive paste layer 5 and the undercoat layer 4 can be easily formed by printing.

In the composition mentioned above the conductive paste layer 5 is directly connected to the IC ground pin connection land 23, so that the potential of this IC ground pin is stabilized, and the generation of radiation noise by potential fluctuation is suppressed. As shown in FIG. 1, the IC ground pin connection land 23 is formed with a wider area than that of the IC signal pin connection land 24. Therefore, impedance at the point of connection to the conductive paste layer 5 can be further reduced so that the radiation noise suppression effect can be enhanced.

In the embodiment shown in FIG. 1, the conductive paste layer 5 and the overcoat layer 6 are formed only on the surface of substrate 1. As a matter of course, it is also desirable to form these layers on the rear side of substrate 1. As the conductive paste layer 5 connection areas A and B are increased, the suppression effect is enhanced.

Figure 2:
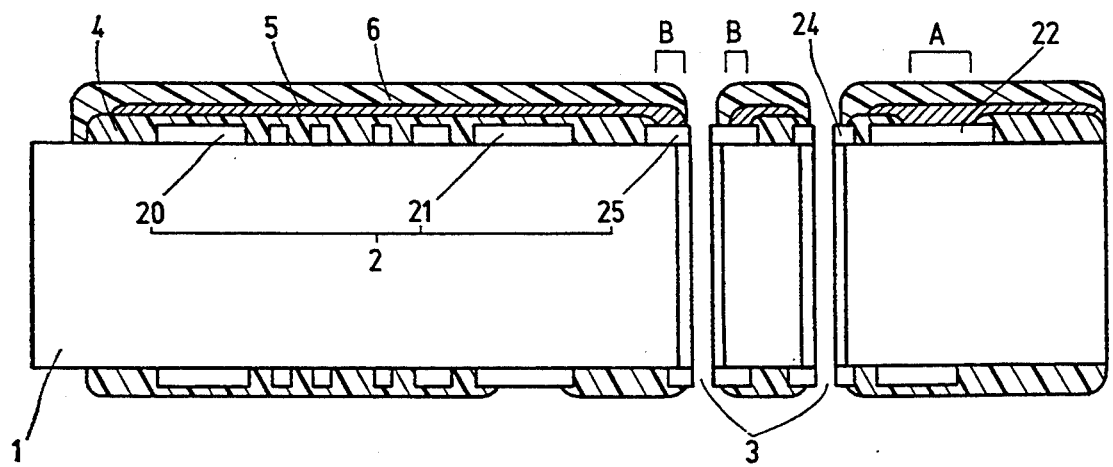

FIG. 2 show a second embodiment of the present invention. Its composition differs from that of printed circuit board shown in FIG. 1 in that the IC pin connection land to be connected to the conductive paste layer 5 is IC power supply pin connection land 25 and that the part to be connected to the conductive paste layer 5 is part of the power supply pattern. The remaining parts are all the same as those shown in FIG. 1. Although the printed circuit board has such a composition, the reference potential of IC is stabilized at the IC power supply pin. Accordingly, the same suppression effect as that obtained on the printed circuit board shown in FIG. 1 can be obtained.

In the second embodiment, the IC ground pin is directly connected to the conductive layer through the land. Therefore, the radiation noise suppression effect is more enhanced than the conventional EMI-prevented printed circuit board which is designed so that the IC ground pin is connected indirectly to the conductive layer through the ground pattern of the substrate. The above-mentioned effect can be further enhanced by widening the area of the IC ground pin connection land.

When the conductive layer cannot be connected to the ground circuit because of a restriction in layout, but a sufficient area to connect it to the power supply pattern can be provided, the same EMI suppression effect as that of printed circuit board where the conductive layer is connected to the ground pattern can be obtained by connecting the above-mentioned conductive layer to this power supply pattern. Accordingly, even on the printed circuit board where the power supply pattern is connected to the conductive layer, the EMI suppression effect can be obtained by increasing the area for the IC power supply pin connection.

Figure 3A:
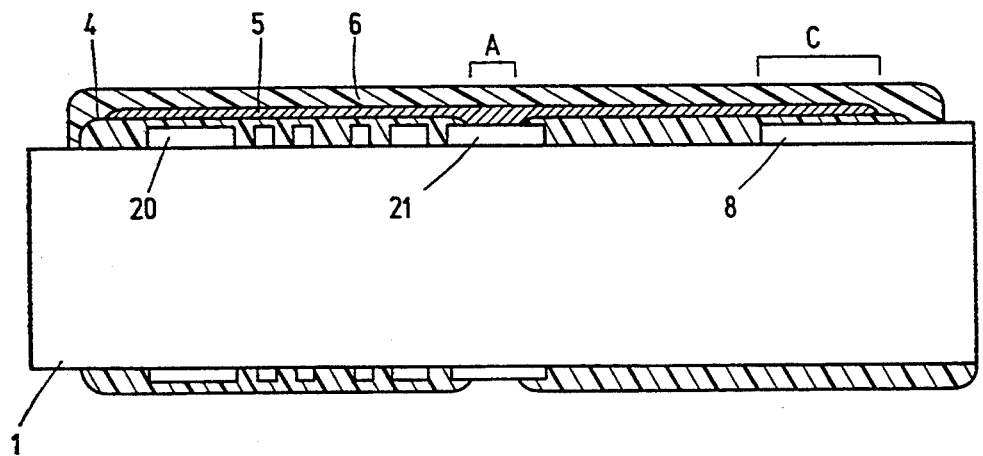
FIG. 3(A), 3(B), 4(A) and 4(B) show an example of the second embodiment of the present invention.
Figure 3B:
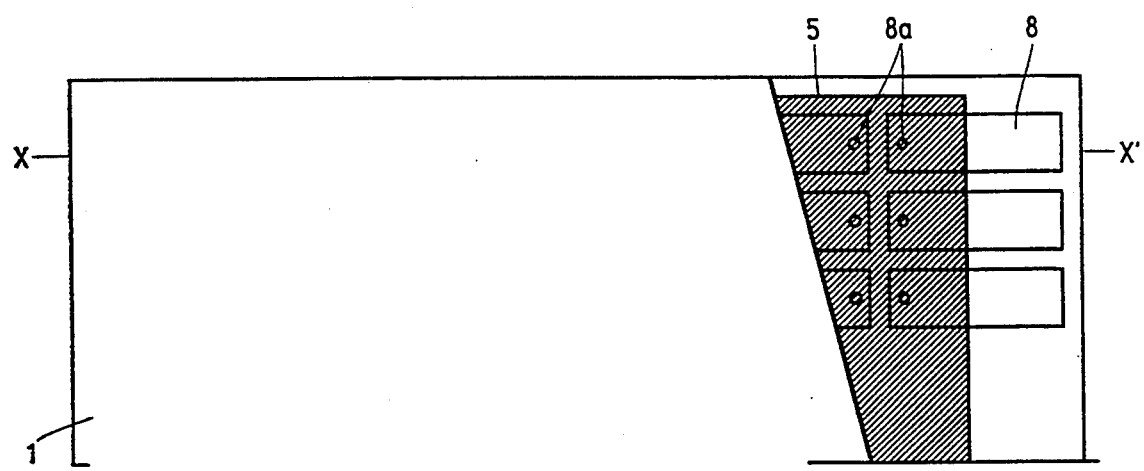

FIG. 3 shows a third embodiment of the printed circuit board which is the of the present invention. FIG. 3 (A) shows the X—X' cross sectional view. FIG. 3 (B) shows a plan view. At first, the circuit pattern shown in the figure is formed on the surface of substrate 1 which is made of an insulation material such as epoxy resin, phenol resin, glass fiber or ceramics. The circuit pattern includes signal pattern 20, ground pattern 21, and a power supply pattern not shown in the figure. In this embodiment, a connector land 8 to which the connector is connected is formed, in addition to this circuit pattern, at the end of substrate 1 with a wider area than that of ordinary connector land 8a, at the same time when the circuit pattern is formed. These patterns are formed by techniques well known photolithography.

After the required patterns are formed, an undercoat layer 4 is formed, leaving a partial area A of ground pattern 21. This undercoat layer 4 is a solder resist layer made of resin insulation material. It is desirable that the area A, exposing the ground pattern 21 is formed at several places on the substrate. At least one exposed area A is required. This undercoat layer 4 is formed by screen printing, so that the upper side of connector land 8 is also covered together with the above-mentioned circuit pattern. After the undercoat layer 4 is formed, the conductive layer 5 for shielding is formed thereon. This conductive layer 5 is also formed by screen printing on the undercoat layer 4 so as to cover the upper side of connector land 8 together with the above-mentioned circuit pattern. In this embodiment, the conductive layer 5 is made of paste.

After the conductive layer 5 is applied, it is heated to cure, and then an overcoat layer 6 made of insulation resin material is formed on the whole upper surface of conductive layer 5. This overcoat layer 6 can be made of the same material as that of undercoat layer 4. It is easily formed by screen printing together with conductive layer 5 and undercoat layer 4.

In the composition mentioned above, the area C where the connector land 8 and the conductive layer 5 located above it are overlapped composes a capacitor at both sides of undercoat layer 4. Since the thickness of undercoat layer 4 is about 20 to 40 $\mu$m, the capacitance necessary for the bypass capacitor can be obtained at the area C having a proper area. Accordingly, the required bypass capacitor can be formed by composing the capacitor section as the area C shown in FIG. 3 (A) for all the connector lands connected to each signal pattern without solder-connecting the bypass capacitor as a discrete part.

Thus, two cases are compared (in one case the connector land and the conductive layer compose the bypass capacitor, in other case the bypass capacitor is used as a discrete part according to the conventional method). There are following differences between them.

At first, when the bypass capacitor is used as a discrete part according to the conventional method, the inductance L of lead wire can be calculated by using the formula (1) assuming that length and diameter of the two lead wires (metal wires) of the bypass capacitor are 5 mm and 0.6 mm, respectively.

$$L = \frac{\mu l}{2\pi}\left(\ln\frac{2l}{r} - 1\right)[H] \tag{1}$$

where $\mu$: magnetic permeability $(=4\pi \times 10^{-7} \text{ [H/m]})$ l: length of the lead wire $(=5 \times 10^{-3} \text{[m]})$ r: radius of the lead wire $(=0.3 \times 10^{-3} \text{[m]})$ Accordingly, the inductance of one lead wire is:

$$L = \frac{4\pi \times 10^{-7} \times 5 \times 10^{-3}}{2\pi}\left(\ln\frac{2 \times 5 \times 10^{-3}}{0.3 \times 10^{-3}} - 1\right)[H]$$

$$= 2.51 \times 10^{-9} \text{ [H]}$$

Assuming that the electrostatic capacitance (C) of the bypass capacitor is $330 \times 10^{-12}$ (F), the series impedance Z consisting of the capacitance and inductance of two lead wires can be calculated by using the formula (2).

$$\frac{1}{2\pi fc} - 2\pi fL \times 2$$

where
f: frequency (Hz)

The impedance at f=100 MHz is calculated as follows:

$$Z = \frac{1}{2\pi \times 100 \times 10^6 \times 330 \times 10^{-12}} - (2\pi \times 2 \times 100 \times 106) \times 2.51 \times 10^{-9}$$
$$= 4.82 - 3.15 = 1.67 [\Omega]$$

In the case when the bypass capacitor is composed of a connector land and a conductive layer, it is sufficient to consider only the electrostatic capacitance. Therefore, the impedance Z can be obtained from the formula (3).

$$Z = \frac{1}{2\pi f c} = \frac{1}{2\pi f * \frac{\epsilon_0 \epsilon_r S}{d}} [\Omega] \qquad (3)$$

where
$\epsilon_0$: dielectric constant in a vacuum $(8.854 * 10^{-12} [F/m])$ $\epsilon_r$: relative dielectric constant of the undercoat layer
S: opposite area of the connector land and the conductive layer (m²)
d: thickness of the undercoat layer (m)

Assuming that $\epsilon_r = 5$, $S = 2$ cm², and $d = 30$ μm, we get:

$$C = \frac{8.854 \times 10^{-12} \times 5 \times 2 \times 10^{-4}}{30 \times 10^{-6}}$$
$$= 2.95 \times 10^{-10} [F]$$

Figure 5:
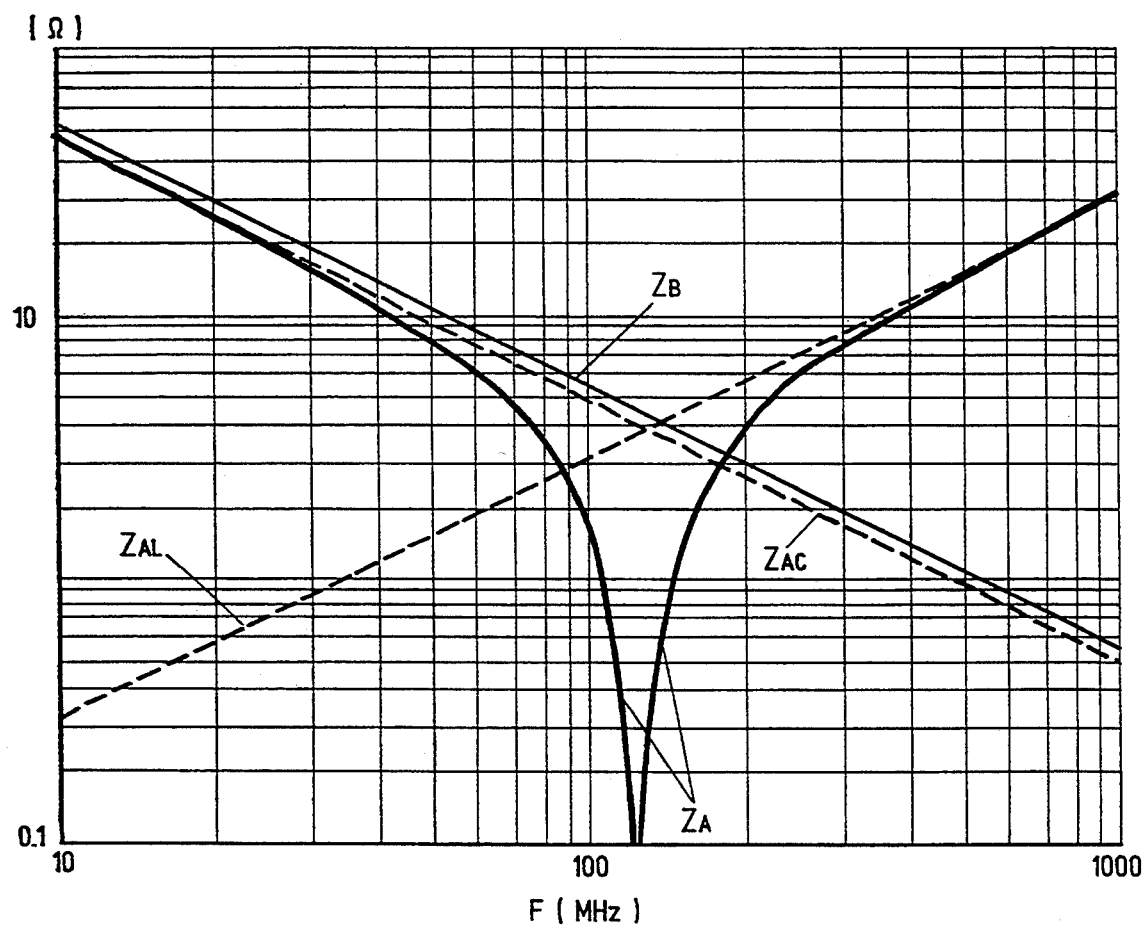
FIG. 5 shows the impedance vs. frequency characteristics of a conventional example of embodiment and the above-mentioned exemplary embodiment of the present invention.

The frequency characteristics from 10 MHz to 1000 MHz vs. impedance are calculated for both and obtained data are plotted in the logarithmic graph (FIG. 5).

In FIG. 5, the abscissa shows the frequency f(MHz) whereas the ordinate shows the absolute value of the impedance $|Z|(\Omega)$. $|Z_A|$ and $|Z_B|$ represent the frequency characteristics of impedance respective of the conventional example and of the present embodiment. $|Z_{AC}|$ and $|Z_{AL}|$ represent the frequency characteristics of the absolute value of the impedance, respectively caused by the electrostatic capacitance of the bypass capacitor and caused by the inductance of the lead wire of the conventional example.

As is evident from FIG. 5, in the conventional example, the absolute value of the impedance caused by the inductance of the lead wire increases as the frequency increases. Owing to the successive addition of increase, the absolute value of the impedance $|Z_A|$ also increases at a frequency of 100 MHz or more.

In the embodiment of the present invention, the bypass capacitor does not have an inductance. Accordingly, the impedance decreases as the frequency increases. Therefore this feature is most useful for the bypass capacitor.

The embodiment shown in FIG. 3 represents a bypass capacitor between connector land 8 and conductive layer 5. Since the power terminal land is formed at the end of substrate 1, a bypass capacitor can be formed between this power terminal land and conductive layer 5. The effect can be further enhanced by using the bypass capacitor as discrete part.

In the embodiment shown in FIG. 3, the conductive layer 5 is connected to the ground pattern 21. It is allowed to connect the conductive layer 5 to the power supply pattern in place of ground pattern 21.

Figure 4A:
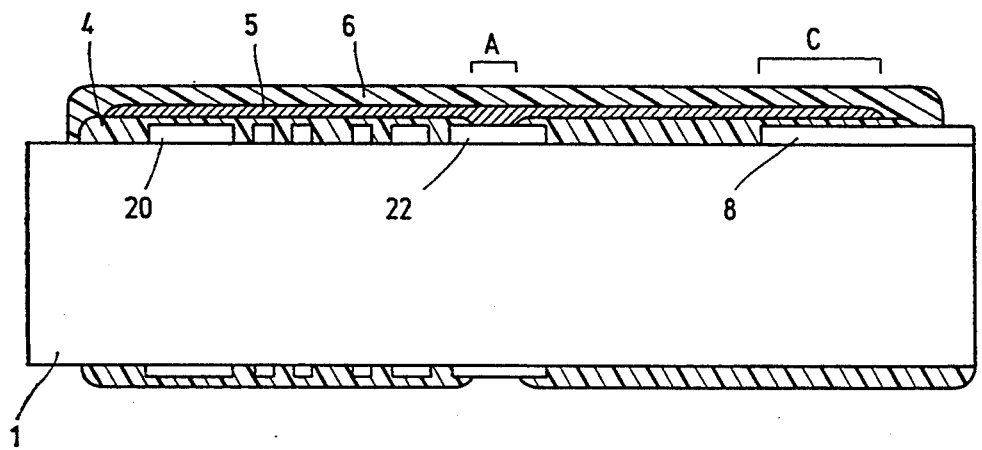
Figure 4B:
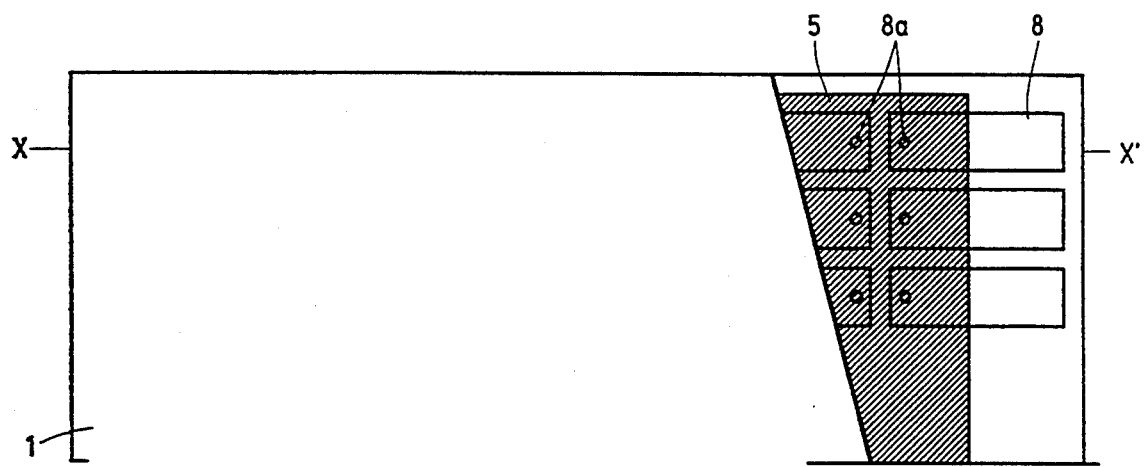

FIG. 4 (A) and FIG. 4 (B) show the examples. That is, when the undercoat layer 4 is formed by screen printing, a part of power supply pattern 22 is left and the conductive layer 5 is formed by printing thereon, so that the potential of conductive layer 5 can be set to power supply voltage. As a result, in the area C a bypass capacitor is formed between the connector land 8 and the power source. Nevertheless, since the power supply impedance can be ignored at high frequency, the same high frequency noise (radiation noise) suppression effect as that-obtained in the embodiment shown in FIG. 3 can be obtained. In the embodiment shown in FIG. 4, the bypass capacitor can be also formed between the ground terminal land and the conductive layer.

As shown in FIG. 3 and FIG. 4, the same effect can be obtained by connecting the conductive layer 5 either to the ground pattern 21 or to the power supply pattern 22. Therefore, in the case where the power supply pattern and the ground pattern is restricted in the layout of substrate, it is possible to select a more effective pattern which is connected to the conductive layer 5 from the viewpoint of high frequency noise suppression effect.

In the embodiment mentioned above there is no need to mount an additional capacitor on the substrate by soldering.

Therefore, the size of the printed circuit board can be reduced. Moreover, since lead wires are not required, inductance does not occur, the excellent frequency characteristics of bypass capacitor. In this invention, formation of a bypass capacitor merely requires extension of the insulation layer and the conductive layer. Therefore, there is no need to increase the printing process. Accordingly, high workability is ensured, and production cost does not increase.

Figure 6A:
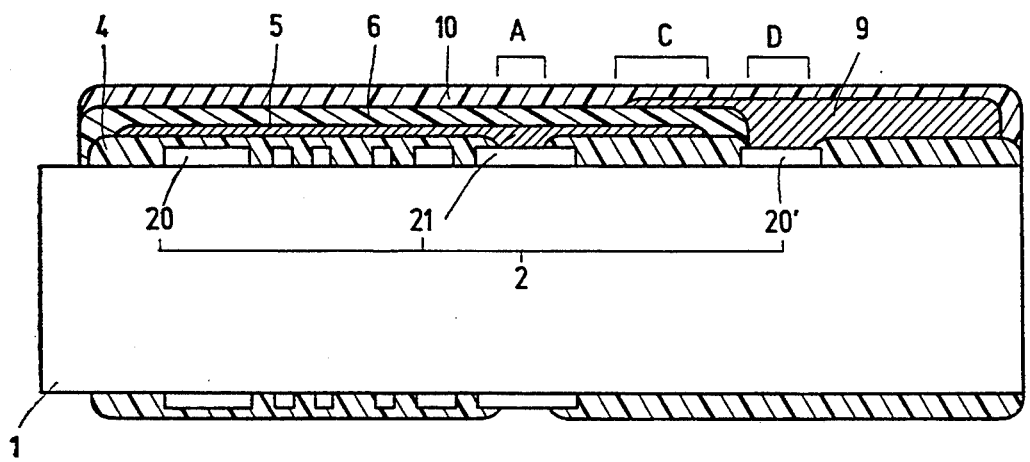
FIG. 6 and FIG. 7 show a cross section of a printed circuit board which is a third embodiment of the present invention.
Figure 6B:
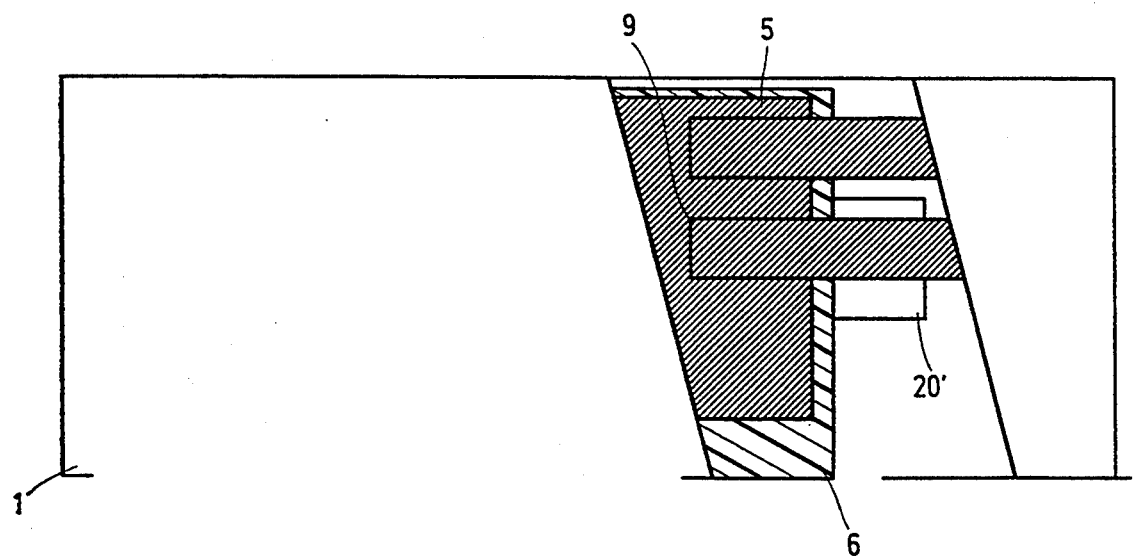

FIG. 6 (A) and FIG. 6 (B) show another embodiment of the printed circuit board of the present invention. The circuit pattern 2 shown in the figure is at first formed on the surface of substrate 1 made of an insulation material such as epoxy resin, phenol resin, glass fiber or ceramics. The circuit pattern includes the signal patterns 20 and 20', ground pattern 21 and a power supply pattern not shown in the figure. These patterns are formed by using well known photolithography techniques. After the required patterns are formed, the first undercoat layer 4 is formed, leaving the partial area D of signal pattern 20° and the partial area A of ground pattern 21. This undercoat layer 4 is a solder resist layer made of a resin insulation material. It is desirable that the area A where the ground pattern 21 is exposed be formed on several places of the substrate. At lease one exposed area is required. This undercoat layer 4 can be easily formed by screen printing. After the first undercoat layer 4 is formed, the first conductive layer 5 for shielding is formed by screen printing thereon. In this case the first conductive layer 5 is formed on the upper surface of the first undercoat layer 4 in the right side range shown in the figure, namely in the range not covering the upper part of signal pattern 20'. The reason why the first conductive layer 5 is formed so that the upper part of signal pattern 20' is not covered is that contact of the first conductive layer 5 to the second conductive layer 9 on the signal pattern 20' must be avoided, as stated below.

The first conductive layer 5 mentioned above is made of a copper paste.

After applying the first conductive layer 5 it is heated to cure, and then the first overcoat layer 6 made of a resin insulation material is formed so as to cover the first conductive layer 5. The first overcoat layer 6 can be made of the same material as that of undercoat layer 4. It can be easily formed by screen printing together with the first conductive layer 5 and undercoat layer 4. After the first overcoat layer 6 is formed, the second conductive layer 9 is formed in the area at the upper part of above-mentioned signal pattern 20. This second conductive layer 9 is formed at the upper part of signal pattern 20' by screen printing, using the same material as that of the first conductive layer 5. Accordingly, it is connected to the signal pattern 20' in the area D. The formation range of the second conductive layer 9 is specified so that its part (left side in the figure) is located opposite the first conductive layer 5. In the figure, the second conductive layer 9 is opposed to the first conductive layer 5 in the area C. In this area C the first overcoat layer 6 is sandwiched between the second conductive layer 9 and the first conductive layer 5, thereby forming a capacitor in this part. After the second conductive layer 9 is formed, the second overcoat layer 10 is formed on the whole surface of substrate. This second overcoat layer 10 is formed by using the same screen printing process and the same material as those applied for the first overcoat layer 6 and undercoat layer 4.

In the composition mentioned above, the first conductive layer 5 and the second conductive layer 9 in the area C are opposed to each other through the first overcoat layer 6, and a capacitor is formed in this part. The first conductive layer 5 is connected to the ground pattern 21 in the area A, and the second conductive layer 9 is connected to the signal pattern 20' in the area D. Therefore the capacitor formed in this area C serves as a bypass capacitor connected to the signal pattern 20'. Since the thickness of the first overcoat layer 6 is extremely small (20 to 40 μm), the bypass capacitor which is formed in the area C has a sufficient capacitance required for a bypass capacitor. Moreover, since the opposing area of first conductive layer 5 and second conductive layer 9 can be easily changed by designing the screen mesh layout, the bypass capacitor having small capacitance and the bypass capacitor having large capacitance can be easily formed.

Above is shown an embodiment where the bypass capacitor is formed between signal pattern 20' and ground pattern 21. It is also allowed to connect the first conductive layer 5 to the power supply pattern in place of ground pattern 21. Even in this configuration the composition of area C does not change. The bypass capacitor having the required capacitance can be obtained.

Figure 7A:
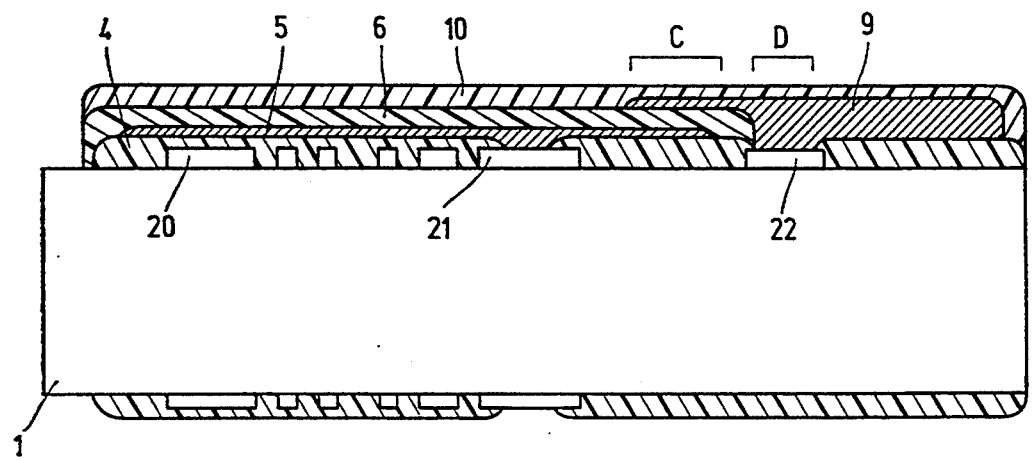
Figure 7B:
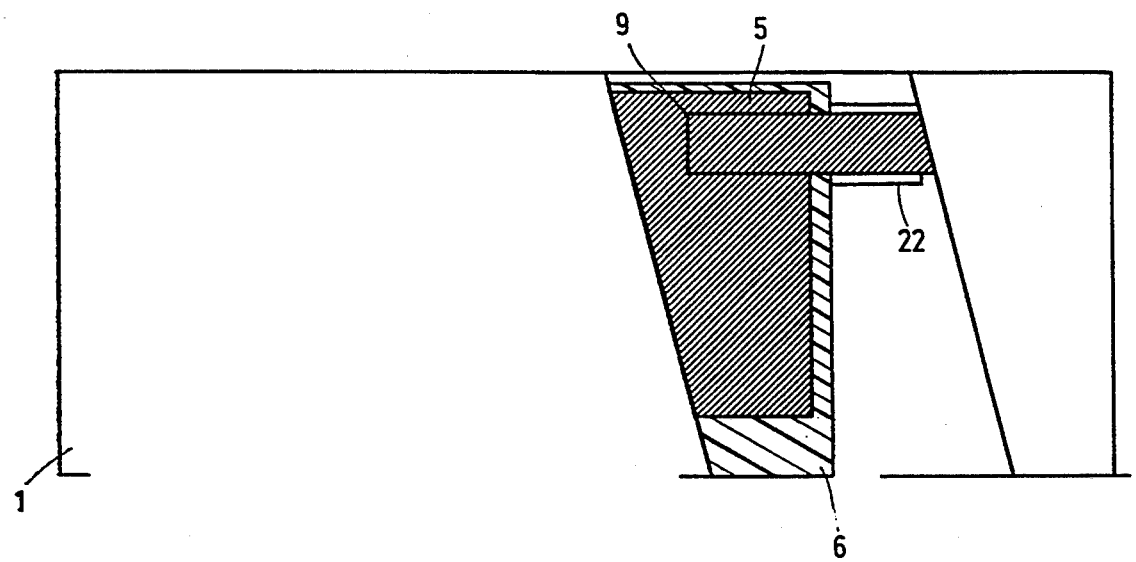

FIG. 7 shows an example of the formation of a bypass capacitor which is formed between the power supply pattern and the ground pattern. The difference between printed circuit boards shown in FIG. 6 and FIG. 7 in their configuration is that the second conductive layer 9 of printed circuit board is connected to the power supply pattern 22, not to the signal pattern 20'. This is the only one difference. Others are all the same. It is also allowed to connect the first conductive layer 5 to the power supply pattern 22 and the second conductive layer 9 to the ground pattern 21. In any case a bypass capacitor to absorb the high frequency noise between the power supply source and the ground pattern is formed in the area C.

In the embodiment shown above, the same radiation noise suppression effect as that obtained on the conventional EMI-prevented printed circuit board can be obtained due to the existence of the first conductive layer. Moreover, if the second insulation layer and the second conductive layer are laminated on the first conductive layer, a bypass capacitor can be formed in a part where the first conductive layer is opposite to the second conductive layer. Therefore the radiation noise suppression effect is ensured and at the same time the size of printed circuit board can be reduced. Since the lead wires are not required, inductance does not occur, so that excellent frequency characteristics of the bypass capacitor can be obtained. Moreover, since all the insulation layers and conductive layers can be formed by using the known screen printing process, the production process can be remarkably simplified.

Figure 8A:
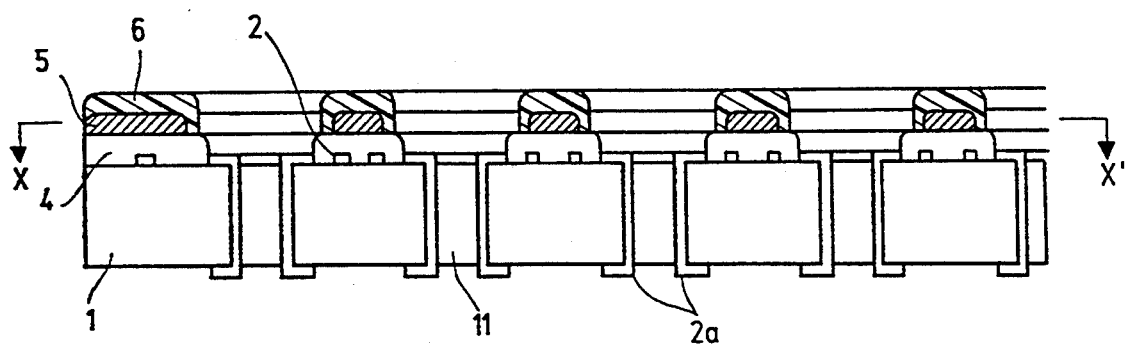
FIG. 8 (A) and FIG. 8 (B) show cross sections of a printed circuit board which is an example of a fourth embodiment of the present invention.
Figure 8B:
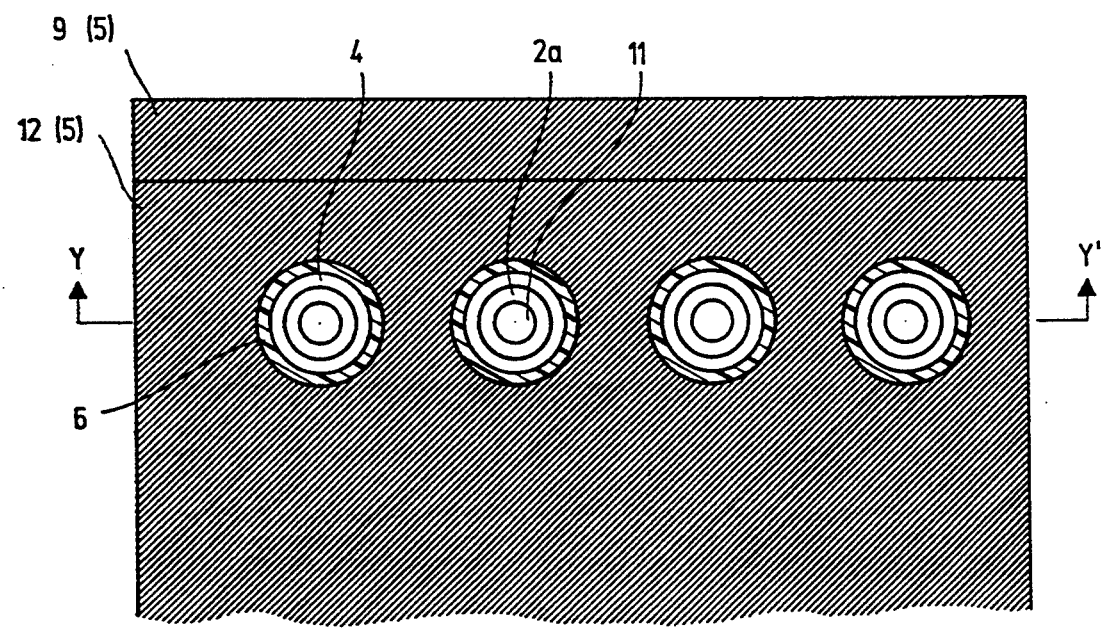

FIG. 8 (A) and FIG. 8 (B) show the cross section of the vicinity of an IC mount part of the printed circuit board which is another embodiment of the present invention.

FIG. 8 (A) and FIG. 8 (B) shows a cross sectional view taken along Y—Y'64 and a cross sectional view taken along line X—X', respectively.

The circuit pattern 2 shown in the figure is formed on the surface of the substrate 1 made of an insulation material such as epoxy resin, phenol resin, glass fiber or ceramics. First the circuit pattern 2, shown in the figures, is formed. This circuit pattern 2 includes the signal pattern, ground pattern, power supply pattern and through-hole copper foil parts. These patterns are formed by known photolithography techniques. After the necessary patterns are formed, the undercoat layer 4 is formed, leaving a partial area of the ground pattern which is not shown in the figure and the land (IC pin land part) 2a of through-hole 11 which is used to insert the IC pin. This undercoat layer a 4 is solder resist layer made of a resin insulation material. It can be formed easily by screen printing. After the undercoat layer 4 is formed, the conductive paste layer 5 similar to the conductive layer of peripheral part 9 is formed by screen printing on the place 12 just under the IC on the undercoat layer 4 so that the peripheral part 9 and the place 12 are successive. In this case, the masking part to be used is IC pin land 2a and a clearance is formed between adjacent pin lands 2a. The conductive paste layer 5 is heated to cure. Then the overcoat layer 6 which is made of insulation resin material, is formed on the whole surface of substrate 1, leaving the land part 2a of the IC pin. The overcoat layer 6 can be made of the same material as that of undercoat layer 4. The conductive paste layer 5 and the undercoat layer 4 can be easily formed by screen printing processes.

In the composition shown above, the conductive paste layer 5 is formed as shown in FIG. 8 (B) so that it does not contact the IC pin land 2a in the area between the IC pin insertion holes. Therefore, the unnecessary high frequency component which is generated in this part can be reduced, so that the radiated noise can be suppressed.

Figure 9:
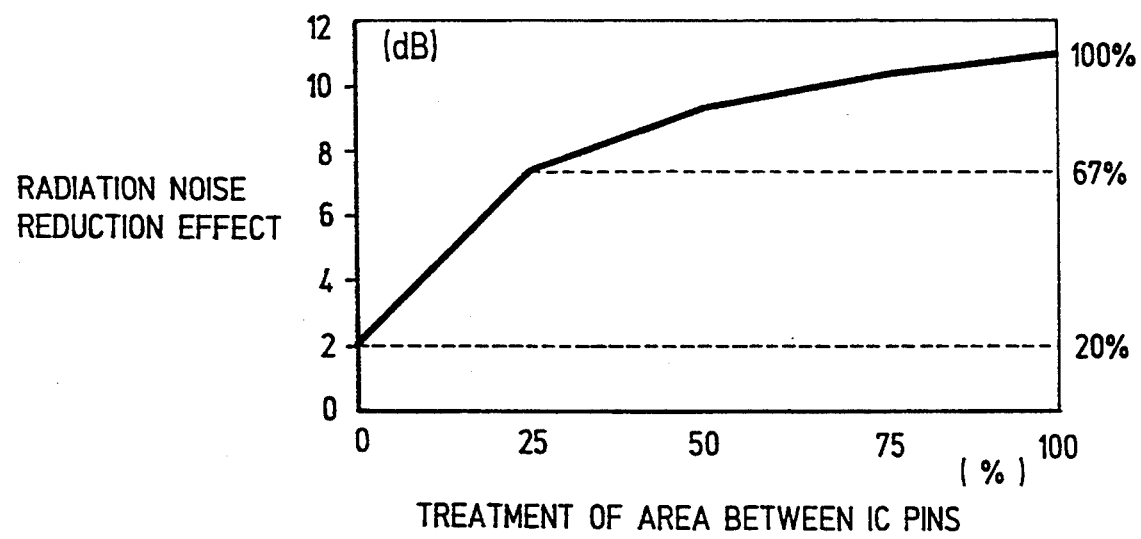
FIG. 9 explains the effect of the printed circuit board of this example of this embodiment.

In this embodiment, the undercoat layer 4, the conductive paste layer 5 and the overcoat 6 can be easily formed by conventional screen printing processes. Accordingly, the EMI- prevented printed circuit board can be easily made without using complicated processes. Moreover, since the above-mentioned conductive paste layer is formed between the IC pin insertion holes, namely between the through-holes, unnecessary high frequency component which is generated in this part can be reduced, so that the radiation noise can be suppressed. Especially, for the IC pin to which a clock or pulse signal is always supplied, the composition described in this embodiment is useful from the viewpoint of reduction of high frequency noise. FIG. 9 shows a graph where the abscissa shows the percentage of the treatment of the area between IC pins of printed circuit board, namely the percentages of the conductive paste layer which is formed in all of the areas between IC pins and the ordinate shows the radiation noise reduction effect. As is evident from this figure, the radiation noise reduction effect is enhanced if the treatment of the area between the IC pins is increased. Accordingly, it is better to increase the treatment of area between IC pins. Even when the conductive paste layer is formed on ¼ area of all areas between the IC pins, a radiation suppression effect of about 7 dB is obtained. Therefore it is evident that the partial formation of a conductive layer between the IC pins is also included in this invention.

It is better to successively form the undercoat layer 4, the conductive paste layer 5 and the overcoat layer 6 also on the rear surface of the substrate, although it is not shown in FIG. 8. In this embodiment the connection point of conductive paste layer 5 is assumed to be the ground pattern. The same effect can be obtained when the connection point of the conductive paste layer 5 is provided on the power supply pattern.

In this embodiment, a part of the conductive layer is also formed between the IC pin insertion holes. Therefore the unnecessary high frequency component which is generated in this part, namely radiation noise, can be suppressed. Especially, on the printed circuit board the radiation noise is generated frequently on the IC pin since clock and pulse signals are always supplied to this part. However, if the composition of this invention is applied, radiation noise is suppressed most effectively. Also, ordinary screen printing processes can be applied for production. Only the conductive layer arrangement pattern must be changed. Therefore the production cost is not raised.

FIG. 10 shows a printed circuit board which is still another embodiment of this invention. First, the circuit pattern as shown in the figure is formed on the surface of substrate 1, which is made of an insulation material such as epoxy resin, phenol resin, glass fiber or ceramics. The circuit pattern includes the signal pattern 20, and the ground pattern 21. These patterns are formed by well known photolithography techniques. After the required patterns are formed, the undercoat layer 4 is formed, leaving partial area A of the ground pattern 21. This undercoat layer 4 is a solder resist layer made of a resin insulation material. It is desirable that the exposed area A of the ground pattern 21 be formed on several places on the substrate. It must be formed at least on one place. This undercoat layer 4 can be formed easily by screen printing processes. After the undercoat layer 4 is formed, the conductive paste layer 5 for shielding is formed by screen printing processes. In this of embodiment this conductive paste layer 5 is made of copper paste and covers almost the whole area of the undercoat layer 4.

After the conductive paste layer 5 is applied, it is heated to cure. Then the overcoat layer 5, which is made an insulation resin material is formed on the whole upper surface of the substrate 1. This overcoat layer 6 can be made of the same material as that of the undercoat layer 4. It can be easily formed by the screen printing process together with the conductive paste layer 5 and the undercoat layer 4.

Figure 10A:
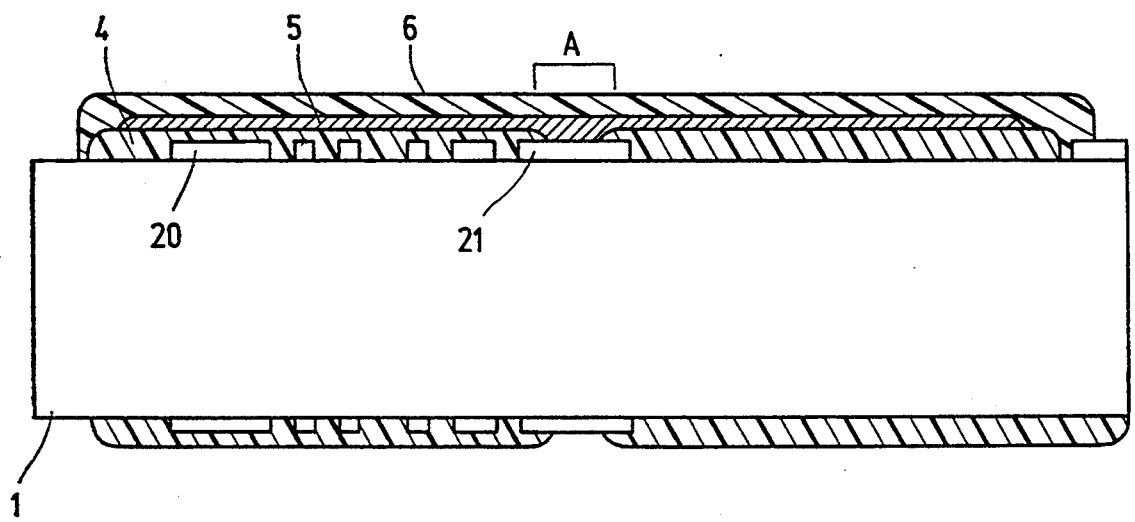
FIG. 10 (A) shows a cross section of a printed circuit board which is an example of a fifth embodiment of this invention.
Figure 10B:
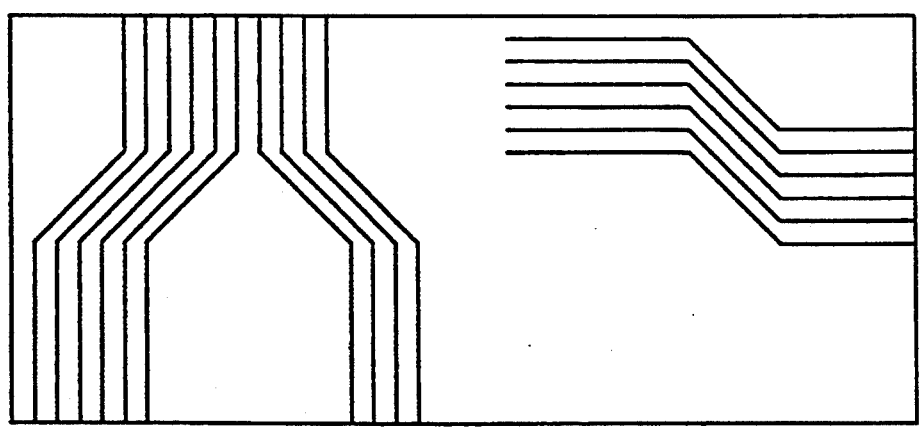
Figure 10C:
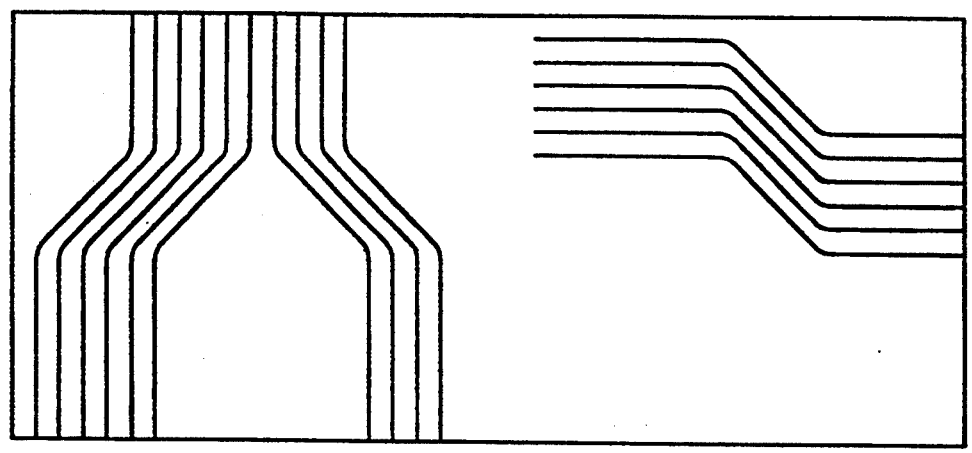
Figure 10D:
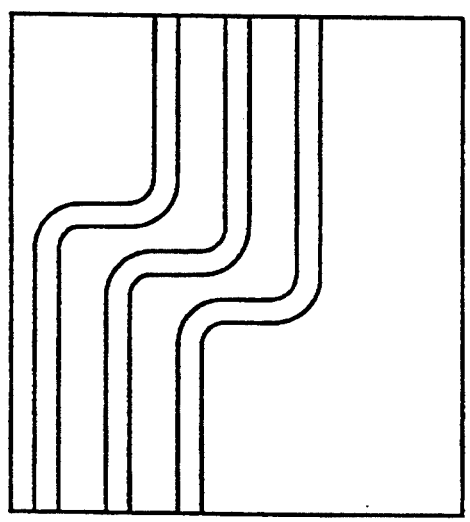

As shown in FIG. 10(B) the signal pattern 20 is wholly arranged so that the interior angle of bent part B is set to approx. 135°. If the pattern of each signal line is set to 135° as shown in the figure, signal reflection at the bent part B is reduced, so that an increase of high frequency impedance is prevented. Accordingly, as compared to the conventional arrangement where the bent part B is set at a right angle, generation of radiation noise (high frequency noise) is less. Although suppression of high frequency noise generation at one bent part B is insignificant, a significant effect is obtained if all the effects are summarized since one substrate usually has many signal line bent parts. The result of experimentation shows that if the interior angle of this bent part is less than 135°, the effect reduces, but at an wider angle than 135° almost the constant effect is obtained. If the interior angle of bent part is larger than 135° as shown in FIG. 10 (B), the specified effect can be obtained. It has been proven that the effect can be obtained by giving R (give circular arc to the bent part B) to the bent part B as shown in FIG. 10 (C) and (D).

Figure 11:
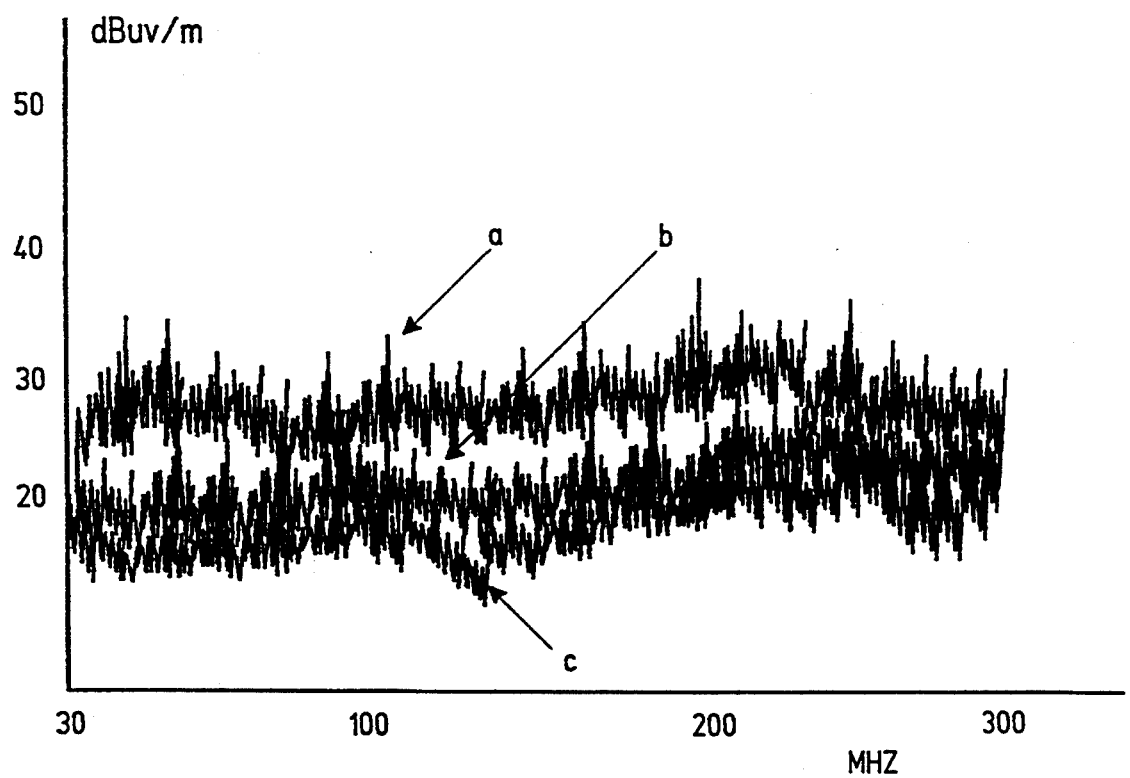
FIG. 11 explains the effect of the printed circuit board which conforms to this example of this embodiment of the invention.

FIG. 11 shows a graph where the abscissa shows the frequency and the ordinate shows the electric field strength. It compares the conventional printed circuit board "a" where the bent part B is at a right angle, the printed circuit board "b" the embodiment shown in FIG. 10 (B) where the interior angle of the bent part B is set to approx. 135°, and the printed circuit board "c" the embodiment shown in FIG. 10 (C) where R is given to the bent part B and the interior angle is set to approx. 135°. As is evident from the figure, excellent magnetic wave suppression effect can be obtained if the printed circuit boards "b" and "c" mentioned in the present embodiment of this invention are used. Although the graph of printed circuit board "d" which is the example of embodiment shown in FIG. 10 (D) does not show, it occupies an intermediate position between the printed circuit boards "a" and "b", not better than "b" and "c" but evidently better than "a". It is desirable to form the conductive paste layer 5 and the overcoat layer 6 also on the rear side of the substrate, although they are not shown in FIG. 10. In the embodiment of the invention mentioned above the conductive paste layer 5 is connected to the ground pattern 21. It is also allowed to connect this conductive paste layer 5 to the power supply pattern not shown in the figure in place of the ground pattern 21.

In the embodiment mentioned above, an increase of high frequency impedance on the bent part can be prevented by setting the interior angle of the bent part wider than approx. 135° or giving a circular arc to this bent part. Therefore and owing to the effect of the conductive layer, the effect of suppression of radiation noise emitted from the whole circuit board is greatly enhanced.

Figure 12:
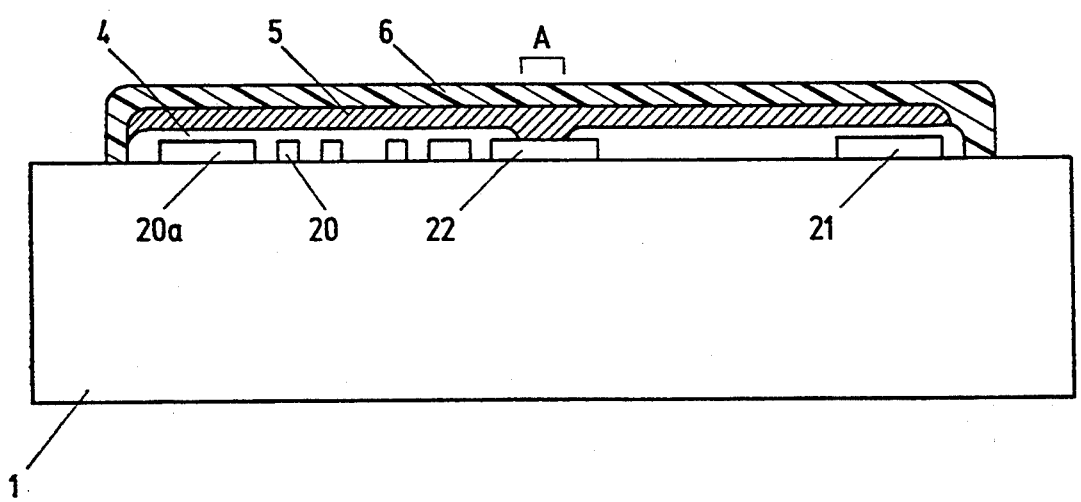
FIG. 12 a cross section of a printed circuit board which is an example of a sixth embodiment of this invention.

FIG. 12 shows still another embodiment of the present invention. At first, the circuit pattern shown in the figure is formed on the surface of substrate 1, which is made of an insulation material such as epoxy resin, phenol resin, glass fiber or ceramics. The circuit pattern includes signal pattern 20, signal land 20a, ground pattern 21 and power supply pattern 22. These patterns can be formed by well known photolithography. After the required patterns are formed, the undercoat layer 4 is formed, leaving the partial area A of the power supply pattern 22. This undercoat layer 4 is solder resist layer made of resin insulation material. It is desirable that the area A where the power supply pattern 22 is exposed is formed with as wide area as possible on the substrate. At least one palace is required. This undercoat layer 4 can be easily formed by screen print. After the undercoat 4 is formed, the conductive paste layer 5 is formed thereon. In this example of embodiment this conductive paste layer 5 is made of copper paste. It covers almost the whole surface of substrate 1.

After the conductive paste layer 5 is applied it is heated to cure. Then the overcoat layer 6 made of insulation material is formed on the whole upper surface of substrate 1. This overcoat layer 6 can be made of the same material as that of the undercoat layer 4. It can be easily formed by screen printing processes together with the conductive paste layer 5 and the undercoat layer 4.

Figure 13:
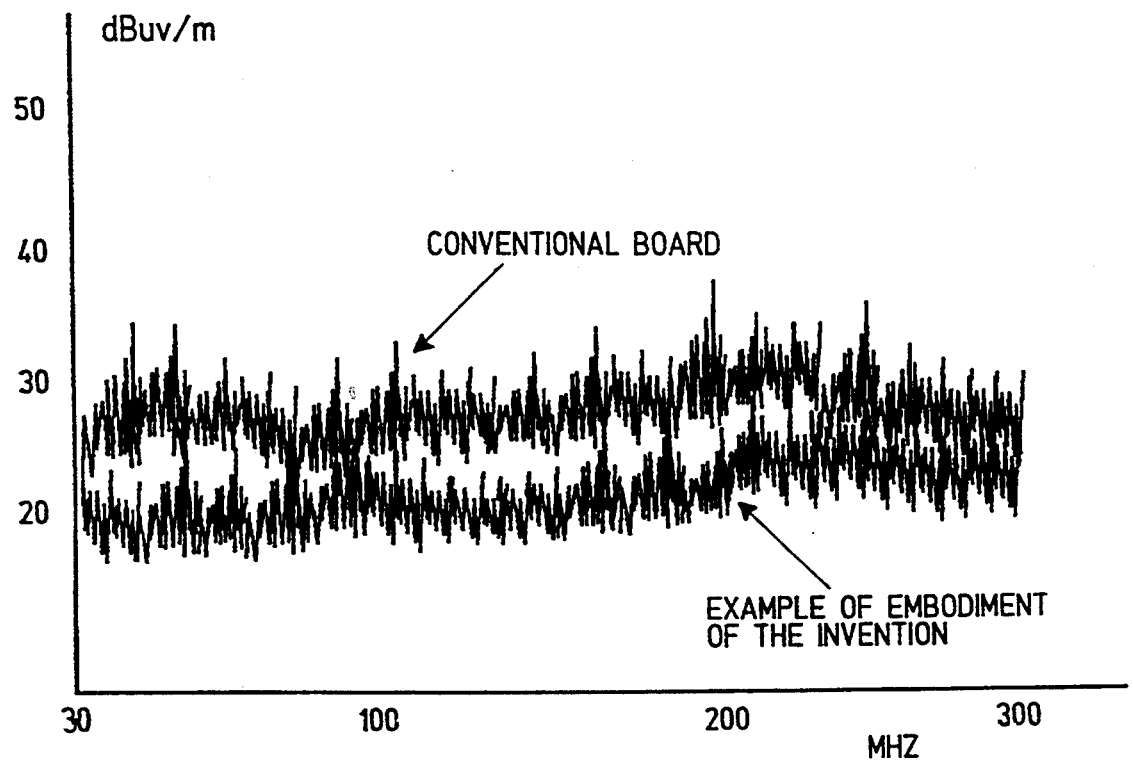
FIG. 13 explains the effect of the printed circuit board which corresponds to this example of this embodiment of the invention.

In the composition mentioned above, the undercoat layer 4, the conductive paste layer 5 and the overcoat layer 6 can be all formed easily by the conventional screen printing process. Accordingly, the EMI-prevented circuit board can be easily made without using the complicated processes. FIG. 13 shows a graph where the abscissa shows frequency and the ordinate shows the radiation electric field strength. It compares the conventional printed circuit board for which an EMI preventing means is not applied and the printed circuit board of the present invention shown in FIG. 12. As shown in this figure, the radiation of electric magnetic waves can be suppressed if the printed circuit board illustrated in the present embodiment of this invention is used. The undercoat layer 4, the conductive paste layer 5 and the overcoat layer 6 are formed successively also on the rear surface of the substrate, although they are not shown in FIG. 12. From the viewpoint of the suppression of electromagnetic wave radiation it is better to form the undercoat layer 4, the conductive paste layer 5 and the overcoat layer 6 on both sides of the substrate as mentioned above.

As mentioned above, if the area of the ground pattern to connect the conductive layer cannot be sufficiently provided owing to the restriction of the layout, but sufficient area of the power supply pattern can be provided, it is possible to make a printed circuit board which has the same EMI suppression effect as the conventional printed circuit board by connecting the conductive layer to the ground pattern, by connecting the above-mentioned conductive layer to this power supply pattern. Moreover, since the the same production process as that applied for the conventional EMI suppressing printed circuit board featuring the conductive layer is connected to the ground pattern can be applied, the production cost does not rise.

What is claimed is:
1. A printed circuit board, comprising:
a substrate;
a circuit pattern formed on the substrate, the circuit pattern including a signal line pattern and a reference potential setting line pattern in which a reference potential is set for the signal line pattern;
an insulation layer formed on the substrate so as to cover the circuit pattern excepting at least a part of the reference potential setting line pattern;
a conductive layer formed on the insulation layer so as to be connected to an uninsulated part of the reference potential setting line pattern said conductive layer including a conductive portion which is overlying a portion of the circuit pattern and separated therefrom by said insulation layer to form a bypass capacitor.

2. A printed circuit board according to claim 1 wherein said conductive portion overlies a conductive land portion of said circuit pattern formed on said substrate.

3. A printed circuit board according to claim 2, wherein said conductive land is a signal connector land to which a signal connector is connected.

4. A printed circuit board according to claim 3, wherein said reference potential setting line pattern is a ground line pattern.

5. A printed circuit board according to claim 3, wherein said reference potential setting line pattern is a power line pattern.

6. A printed circuit board according to claim 2, wherein said conductive land is a power supply terminal land to which a power supply connector is connected and said reference potential setting line pattern is a ground line pattern.

7. A printed circuit board according to claim 2, wherein said conductive land is a ground terminal land to which a ground connector is connected and said reference potential setting line pattern is a power line pattern.

8. A printed circuit board according to claim 1, wherein said conductive portion is formed on an insulation layer overlying a portion of said circuit pattern connected to said signal line pattern.

9. A printed circuit board according to claim 1, wherein said conductive portion is formed on an insulation layer overlying a portion of said power line pattern and said reference potential setting line pattern is a ground line pattern.

10. A printed circuit board according to claim 1, wherein said conductive portion is formed on an insulation layer overlying a portion of said ground line pattern and said reference potential setting line pattern is a power line pattern.

11. A printed circuit board according to claim 1, wherein an interior angle of a bent part of said signal line pattern in said circuit pattern is at least 135 degrees.

12. A printed circuit board according to claim 1, wherein a bent part of said signal line pattern in said circuit pattern is set in the form of a circular arc.

13. A printed circuit board according to claim 1, wherein said insulation layer and said conductive layer are formed by a screen printing process.

* * * * *